US008743449B2

(12) United States Patent
Xie et al.

(10) Patent No.: US 8,743,449 B2
(45) Date of Patent: Jun. 3, 2014

(54) METHOD AND APPARATUS FOR PROVIDING HIGH-FILL-FACTOR MICROMIRROR/MICROMIRROR ARRAYS WITH SURFACE MOUNTING CAPABILITY

(76) Inventors: Huikai Xie, Gainesville, FL (US); Kemiao Jia, Gainesville, FL (US)

( * ) Notice: Subject to any disclaimer, the term of this patent is extended or adjusted under 35 U.S.C. 154(b) by 21 days.

(21) Appl. No.: 13/148,019

(22) PCT Filed: Jun. 1, 2010

(86) PCT No.: PCT/US2010/036925
§ 371 (c)(1),
(2), (4) Date: Aug. 12, 2011

(87) PCT Pub. No.: WO2010/138968
PCT Pub. Date: Dec. 2, 2010

(65) Prior Publication Data
US 2011/0292490 A1    Dec. 1, 2011

Related U.S. Application Data

(60) Provisional application No. 61/182,502, filed on May 29, 2009.

(51) Int. Cl.
*G02B 26/00* (2006.01)
*G02B 26/08* (2006.01)
*B29D 11/00* (2006.01)

(52) U.S. Cl.
CPC .................................. *G02B 26/0841* (2013.01)
USPC ..................... 359/290; 359/212.1; 359/224.1; 216/24

(58) Field of Classification Search
USPC ............... 216/24; 438/689; 359/212.1, 223.1, 359/224.1, 290
See application file for complete search history.

(56) References Cited

U.S. PATENT DOCUMENTS

| 6,681,063 B1 | 1/2004 | Kane et al. |
| 7,012,752 B2 * | 3/2006 | Choi et al. ..................... 359/578 |
| 2006/0077525 A1 | 4/2006 | Huibers |
| 2010/0033788 A1 | 2/2010 | Xie et al. |

FOREIGN PATENT DOCUMENTS

WO   WO-2009/079460 A1   6/2009

OTHER PUBLICATIONS

Gilgunn, P.J., et al., "Flip-Chip Integrated SOI-CMOS-MEMS Fabrication Technology," Solid-State Sensors, Actuators, and Microsystems Workshop, Jun. 1-5, 2008, Hilton Head Island, SC, pp. 10-13.
Jia, K., et al., "An Agile Tip-Tilt-Piston Micromirror with Large Aperture, Large Scanning Range and Low Driving Voltage," Solid-State Sensors, Actuators, and Microsystems Workshop, Jun. 1-5, 2008, Hilton Head Island, SC, pp. 284-287.
Xie, H., "Large-Range Large-Aperture MEMS Micromirrors for Biomedical Imaging Applications," IEEE, 9th International Conference on Solid-State and Integrated-Circuit Technology, Oct. 20-23, 2008, Beijing, China, p. 2549-2552.

* cited by examiner

*Primary Examiner* — William Choi
(74) *Attorney, Agent, or Firm* — Saliwanchik, Lloyd & Eisenschenk

(57) ABSTRACT

Embodiments of the subject invention relate to micromirror devices and methods of fabricating a micromirror/micromirror array. According to an embodiment, micromirrors can be fabricated from a semiconductor substrate where after forming actuators and bonding pads on a front side of the semiconductor substrate, the device is flipped over to have a portion of the back side of the substrate removed and formed to become the mirror plate surface. The subject micromirrors can allow further miniaturization of endoscopes and other optical applications without sacrificing the optical aperture through their surface mounting capabilities.

49 Claims, 12 Drawing Sheets

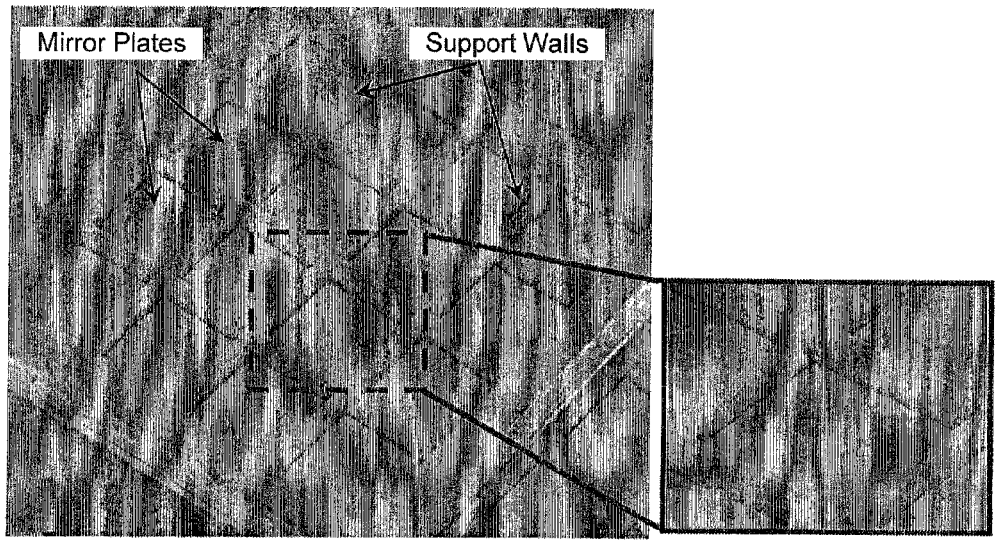
FIG. 9A  FIG. 9B
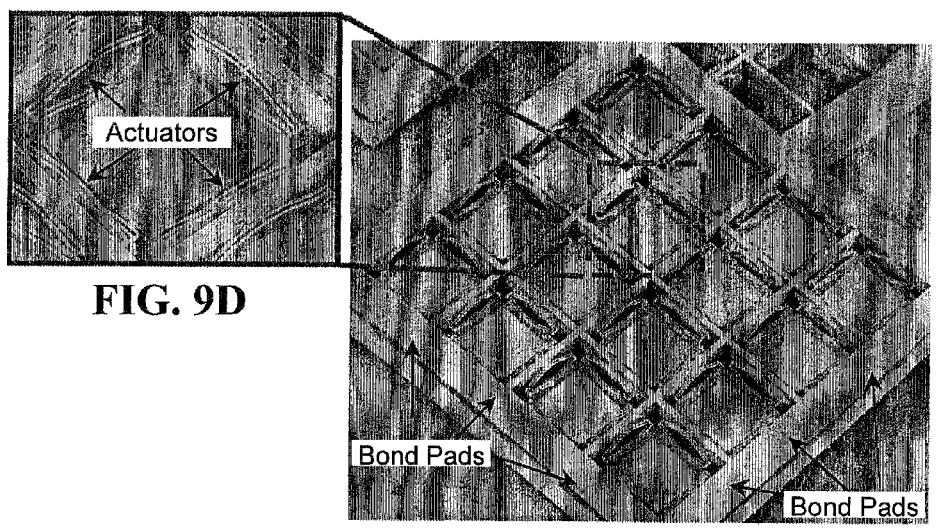
FIG. 9D
FIG. 9C

METHOD AND APPARATUS FOR PROVIDING HIGH-FILL-FACTOR MICROMIRROR/MICROMIRROR ARRAYS WITH SURFACE MOUNTING CAPABILITY

CROSS-REFERENCE TO RELATED APPLICATIONS

The present application is the U.S. national stage application of International Patent Application No. PCT/US2010/036925, filed Jun. 1, 2010, which claims the benefit of U.S. Provisional Application Ser. No. 61/182,502, filed May 29, 2009, both of which are hereby incorporated by reference herein in their entirety, including any figures, tables, or drawings.

The subject invention was made with government support under a research project supported by National Science Foundation, Contract No. ECCS-0725598. The government has certain rights to this invention.

BACKGROUND OF INVENTION

Micromirrors and micromirror arrays can be used in a variety of applications. As an example, as individual devices, micromirrors can be applied to endoscopic optical imaging applications as the optical scan engine for various imaging modalities including, but not limited to Confocal Laser Scanning Microscope (CLSM), Non-linear Optical Microscope (NLOM), and Optical Coherence Tomography (OCT). Further, as an array of devices, micromirror arrays can be used as an optical phased array (OPA) for laser detection and ranging applications, such as those utilized in national defense and homeland security. Preferably, for use in OPAs, the micromirror arrays should generate tip/tilt and piston (TTP) motions.

Micromirror arrays can also be used as a wave front correction device in adaptive optics systems. In addition, micromirror arrays can play an important role in aerospace exploration and astronomy studies.

In the above mentioned applications, such as when being used as the optical scan engine for an endoscope, micromirrors having a high fill factor and, in particular, those having a small device footprint and large optical aperture, are desired.

The device footprint of a micromirror is determined, in large part, by its form factor. For micromirror arrays, the fill factor also strongly impacts the coupling efficiency, resolution, and speed of the micromirror array. As mentioned above, in many applications, a high fill factor is desired.

Existing high-fill-factor (HFF) micromirror/micromirror arrays are typically based on electrostatic actuation or electrothermal actuation. Currently, there are two types of HFF electrostatic micromirror/micromirror arrays. The first type is formed through thin film micromachining technology. The second type is formed through bulk silicon micromachining technology. HFF electrostatic micromirror/micromirror arrays based on thin-film MEMS process (e.g., MUMPs and SUMMiT-V) commonly only produce small-aperture-size mirrors, and therefore are not typically suitable for optical imaging. This is because as optical imaging requires large apertures to obtain high resolution. HFF electrostatic micromirror/micromirror arrays with bulk silicon mirror plates can provide large optical apertures. However, HFF micromirror/micromirror arrays with bulk silicon plates commonly require either dedicated bonding steps for mirror plate transfer or a specially designed substrate, making the fabrication processes complicated and expensive.

Existing electrothermal actuation micromirror/micromirror arrays utilize flip chip bonding for mirror plate transfer. For example, a HFF electrothermal micromirror array with a bulk silicon mirror plate was also reported, but it requires flip-chip bonding process for mirror plate transfer and has limited degrees of freedom. "Flip-Chip Integrated SOI-CMOS-MEMS Fabrication Technology," by P. J. Gilgunn and G. K. Fedder, (Hilton Head Solid-State Sensors, Actuators and Microsystem Workshop, pp. 10-13 (June 2008)).

Other common drawbacks of both electrostatic and electrothermal HFF micromirror arrays include that the mirror plates do not have mechanical protection and the arrays need dedicated packaging steps for the devices to be ready to use.

BRIEF SUMMARY

Embodiments of the invention relate to a method for fabricating high-fill-factor micromirrors. Embodiments of the subject micromirrors can be utilized in a variety of applications.

According to an aspect of the present invention, devices can be fabricated that do not require an additional packaging process to provide surface mount capabilities.

Embodiments of the present invention relate to scanning micromirrors and methods for fabricating the same. In one embodiment, silicon walls are formed around the mirror plate to provide mechanical protection. In a specific embodiment, the silicon walls are created during a back-side etch process of a substrate in which the mirror plate and actuators are formed. Certain implementations of the present invention utilize electrothermal bimorph actuation.

According to embodiments of the present invention, the fabricated chip can be flipped over at the end of the fabrication process so that the original back surface becomes the reflective top mirror surface, the actuators become hidden, and the bonding pads are ready for flip-chip bonding or surface mounting.

BRIEF DESCRIPTION OF DRAWINGS

FIGS. 9A-9D show SEMs of a 4×4 micromirror array (MMA) device, fabricated in accordance with an embodiment of the subject invention, where FIG. 9A shows a top view (reflective mirror side); FIG. 9B shows one mirror pixel; FIG. 9C shows a back side view showing actuators and bonding pads; and FIG. 9D shows a close-up of the back side of a mirror pixel showing the four actuators.

FIG. 10A shows M1&M2 piston down; FIG. 10B shows M3&M4 piston down; FIG. 10C shows M1&M4 tip tilt; and FIG. 10D shows M2&M3 tip tilt.

FIG. 14A shows a top view (reflective mirror side); FIG. 14B shows one mirror pixel; FIG. 14C shows a back side view showing actuators and bonding pads; and FIG. 14D shows a close-up of the back side of a mirror pixel showing the four actuators.

DETAILED DISCLOSURE

Embodiments of the present invention relate to a method and apparatus for providing high-fill factor micromirrors. Embodiments of the subject micromirrors can be used in a variety of applications. Specific embodiments relate to high-fill factor micromirror arrays.

According to one aspect of the present invention, a device is provided that does not require wafer bonding steps during any of the fabrication process, while still providing high-area-fill-factor mirror plate. In a specific embodiment, the mirror plate can be a bulk silicon supported mirror plate with multi degrees of freedom.

In accordance with an embodiment, the mirror plate, after fabrication, will automatically have walls formed from the substrate as mechanical protection, greatly reducing the chance of damage during post-fabrication handling and assembling. For embodiments utilizing silicon based substrates to fabricate the subject micromirrors, the walls can be formed of silicon from the silicon based substrate.

According to embodiments, the fabricated devices do not need an additional packaging process and are readily capable for surface-mount integration with a driving circuit.

According to another aspect of the present invention, scanning micromirrors are provided that are based on multimorph actuation. A multimorph actuator incorporates two or more materials, wherein each material deforms differently upon application of a stimulus, such as heat, a magnetic field, a voltage potential, among other possible stimuli. The materials are typically formed in layers and stacked. Difference in strains produced in the layers of a multimorph generally produces bending, thereby leading to actuation. A two material multimorph is typically referred to as a bimorph.

Figure 1:
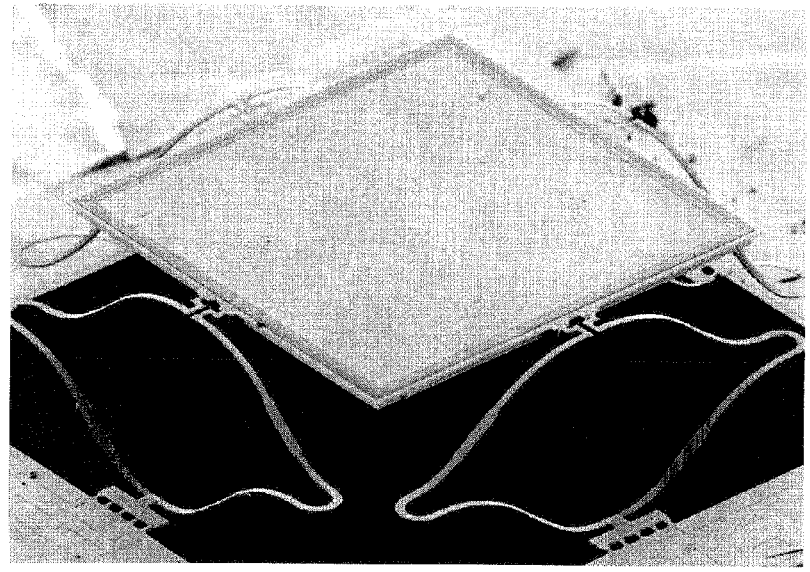
FIG. 1 shows a SEM image of a bimorph actuated micromirror capable of tip/tilt and piston (TTP) motions.

According to another aspect of the present invention, scanning micromirrors are provided that are based on electrothermal bimorph actuation. According to embodiments of the present invention, the electrothermal actuation for the subject micromirror devices can be accomplished through inverted series connected bimorph actuators such as shown in FIG. 1. Examples of bimorph actuators that can be used with embodiments of the subject invention are described in U.S. Provisional Patent Application Ser. No. 61/085,752, filed on Aug. 1, 2008, and titled "Fabrication Method for High-Fill-Factor Micromirrors/Micromirror Arrays"; U.S. patent application Ser. No. 12/534,514, filed on Aug. 3, 2009, and titled "Micromirror and Fabrication Method for Producing Micromirror"; and PCT Application Ser. No. PCT/US2008/086844, filed on Dec. 15, 2008, and titled "Electrothermal Microactuator for Large Vertical Displacement without Tilt or Lateral Shift", which are all hereby incorporated by reference in their entirety.

The actuation is based on bimorph (or bi-layer) structures which generate motions when temperature changes. The bimorph structures can also incorporate one or more added layers for mechanical support and/or providing an additional thermal expansion coefficient. The temperature-induced motion is caused by the thermal expansion coefficient difference of the two materials forming the bimorphs.

Figure 15:
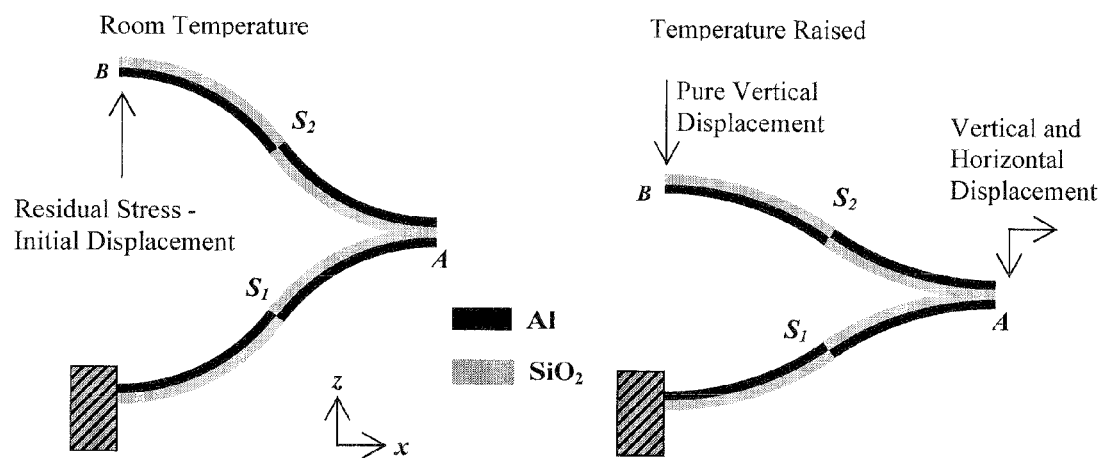
FIG. 15 shows an inverted-series-connected S-shaped vertical actuator design that can be used with a bimorph actuated micromirror in accordance with an embodiment of the subject invention.

In one embodiment, the actuators can be inverted-series-connected (ISC) bimorph actuators. The ISC bimorph actuators can be used to achieve tip, tilt and piston scanning. Referring to FIG. 15, an ISC bimorph actuator includes two S-shaped bimorph sections attached end-to-end. An individual S-shape section can have two bimorph sections attached in series where one section has a high-CTE (coefficient of thermal expansion) top metal layer and a low-CTE bottom dielectric layer, and the adjacent section has opposite layer composition. The high-CTE metal can be, for example, aluminum (Al). The low-CTE dielectric can be, for example, silicon dioxide ($SiO_2$). This alternating construction of the material layers allows each bimorph section to have equal and opposite curvature upon actuation so that the beam deforms to an S-shape and has zero tangential angle at the end. Each S-shape section has a lateral displacement when actuated. Point A in FIG. 15 moves in both x and z directions. However, the lateral shifts of $S_1$ and $S_2$ cancel each other, resulting in a pure z-displacement at point B.

Referring to FIG. 1, the mirror plate is shown in the up position with the bonding pads being on the same side as the micromirror, such that wire bonding needs to be used for bonding to the bonding pad as to not damage the micromirror during bonding. When the bimorph actuators are actuated for the micromirror in FIG. 1 the micromirror is actuated down, and when the bimorph actuators are fully actuated the micromirror is actuated to a down position. Furthermore, due to the fabrication process and the structure of the device, the micromirror cannot be extended over the bimorph actuators.

Figure 2:
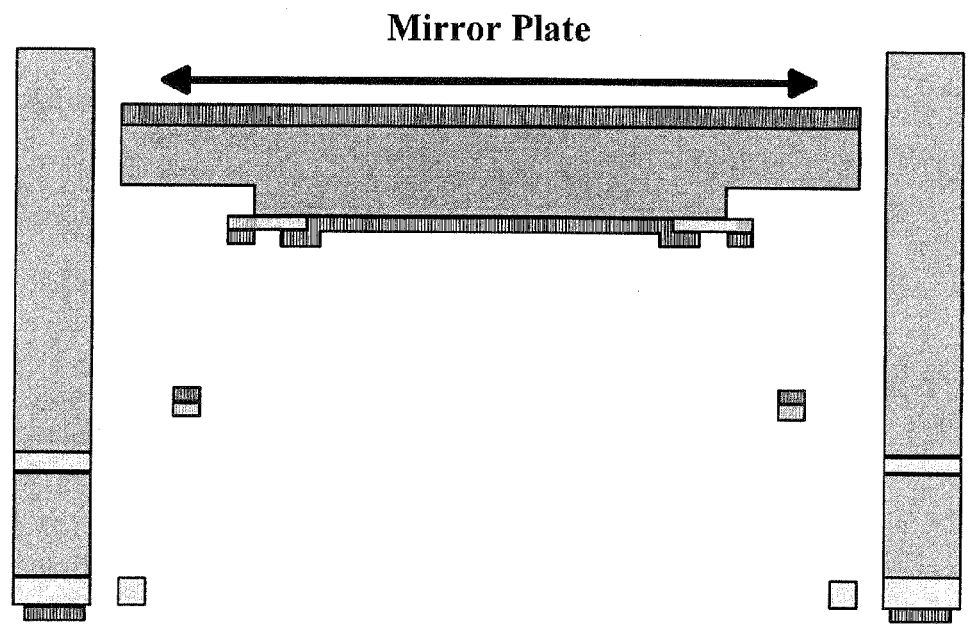
FIG. 2 shows a cross-sectional representation of a micromirror utilizing electrothermal bimorph actuation in accordance with an embodiment of the subject invention.

An embodiment of the present invention can include one or more protective, or support, walls 10, such as shown in FIG. 2 and FIGS. 9A and 9B, where the protective walls are positioned so as to protect the micromirror from damage. In a specific embodiment, a protective wall can be even with or above the micromirror when the micromirror is in a lowered position, in a partially raised position, and/or in a fully raised position. In further embodiments, a protective wall can be even with or above the micromirror when the micromirror is in a lowered position, but below the micromirror when the micromirror is in a fully raised position. Other relationships between the protective wall and the micromirror can also be accomplished. The protective wall can protect portions of one or more sides. In a specific embodiment, the protective wall protects all four sides of the micromirror. In addition, the mirror plate can be fabricated from the side opposite to the actuators.

According to one embodiment, a protective wall is provided at the outer perimeter of a two-dimensional array of micromirrors and smaller support walls are provided between adjacent micromirrors of the array. The support walls can be smaller in height and/or thickness (width). For example, thin support walls can allow for adjacent micromirrors of the micromirror array to be closer together. In certain embodiments, the thickness of the support walls are limited by the thickness required to run a trace for power connections to the actuators. In addition, the support walls can be smaller in height than the protective wall at the outer perimeter. In one embodiment, a portion of a micromirror's mirror plate can extend over at least a portion of the support wall.

Figure 3A:
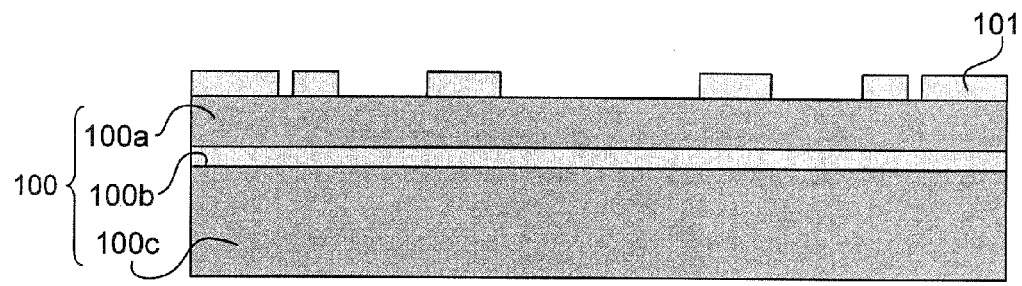
FIGS. 3A-3H show cross-sectional views of a fabrication process in accordance with an embodiment of the subject invention.
Figure 3B:
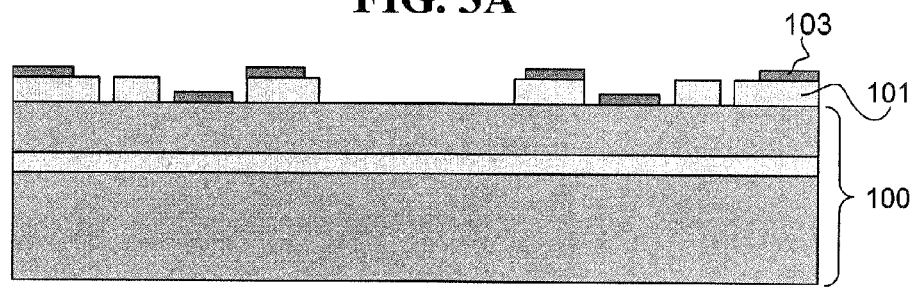

FIGS. 3A-3H illustrate a fabrication process according to an embodiment of the present invention that can be used to fabricate a HFF Micromirror/Micromirror Array. Although the fabrication of a single micromirror is shown in FIG. 3A-3H, the subject fabrication method can form a micromirror array in the substrate. Referring to FIG. 3A, a silicon-on-insulator (SOI) wafer 100, having a silicon device layer 100a, buried oxide layer 100b, and Si substrate 100c, can be used as the base substrate.

Figure 3C:
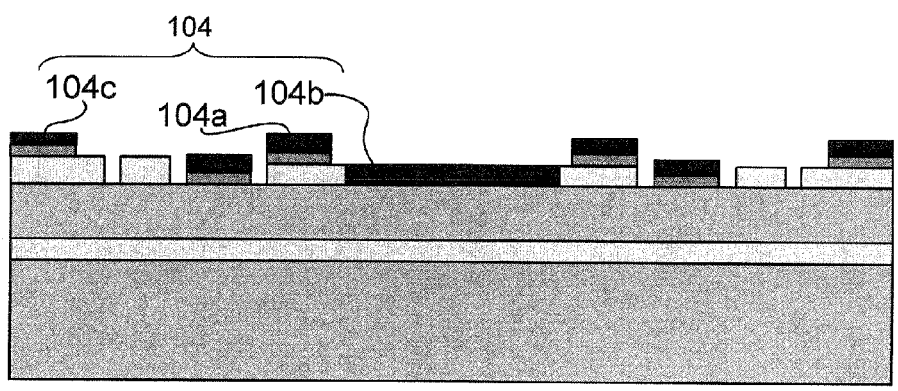

First, an insulating layer can be formed on the top surface of the substrate 100 (e.g., the top surface of device layer 100a). The first insulating layer can be patterned into first insulating layer patterns 101 for the bottom layer of the bimorph actuators, such that the bimorph actuators can have a bottom layer of insulating material. In an embodiment, a thin film PECVD $SiO_2$ is deposited and patterned to form bimorph actuators that use $SiO_2$ as the bottom layer. Then, referring to FIG. 3B, a second insulating layer (not shown) can be formed on the first insulating layer patterns 101 and first metal can be deposited and patterned into first metal patterns 103 for the resistive (heat) elements of the actuators. In an embodiment, a thin protective layer of $SiO_2$ is deposited, followed by Cr—Pt—Cr sputtering and lift-off to form the resistors. After this, as shown in FIG. 3C, a second metal can be deposited and patterned to form second metal patterns 104 for defining the bimorph actuators (104a) and the back side (104b) of the mirror plate, and optionally defining bonding pads (104c). In an embodiment, aluminum lift-off can be performed to define the bimorph actuators and the mirror plate. In an alternate embodiment, the second metal pattern on the back side of the mirror plate (104b) can be omitted. In certain embodiments, the pattern 104b is provided on the back side of the mirror plate to achieve high reflectivity and the material used as the pattern on the back side of the mirror plate can be selected accordingly. When the second metal is reflective, such as in the example described above, the second metal can be used for the pattern on the back side of the mirror plate.

In another embodiment, the second metal is replaced by a polymer, for example a polyimide or PMMI (poly-N-methyl methacrylimide). When the second metal is replaced by a polymer, the first metal can be used as the metal layer of the bimorph actuators (the heater portion) and the bonding pads. In accordance with certain embodiments of the invention, the two layers for the bimorphs can be any combination of two materials having different expansion coefficients. For example, a metal and a dielectric, a metal and a polymer, a metal and a metal, a polymer and a polymer, or a polymer and a dielectric can be used for the two layers of the bimorphs. When a non-conductive polymer layer is used as the final layer of the bimorph actuator, the polymer layer is not used as part of the bonding pads. Instead, in one embodiment, the bonding pads may be formed from the heater metal embedded in the bimorph.

Figure 3D:
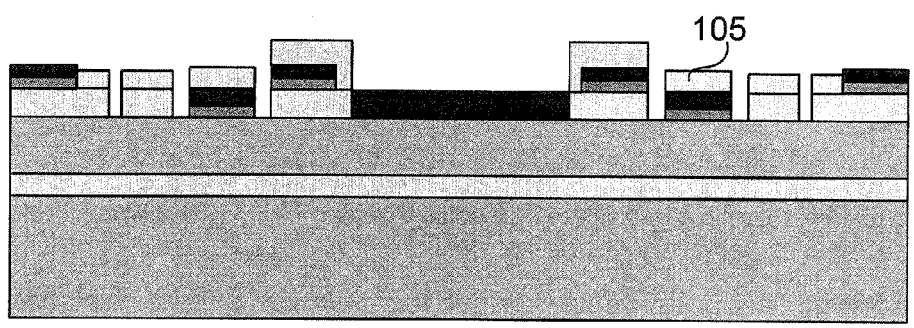

Next, referring to FIG. 3D, a third insulating layer can be deposited and patterned into third insulating layer patterns 105 for the top layer of the bimorph actuators having a top layer of insulating material. The third insulating layer can be, for example, $SiO_2$. In certain embodiments, the first insulating layer forming the first insulating layer patterns 101 and/or the third insulating layer forming the third insulating layer patterns 105 can be replaced with another material such as a polymer as described above.

The steps shown in FIGS. 3A-3D can use patterns similar to those described by Jia et al. in "An Agile Tip-Tilt-Piston Micromirror With Large Aperture, Large Scanning Range and Low Driving Voltage," Solid-State Sensors, Actuators, and Microsystems Workshop, Hilton Head, S.C., June 2008, which is hereby incorporated by reference in its entirety.

Figure 3E:
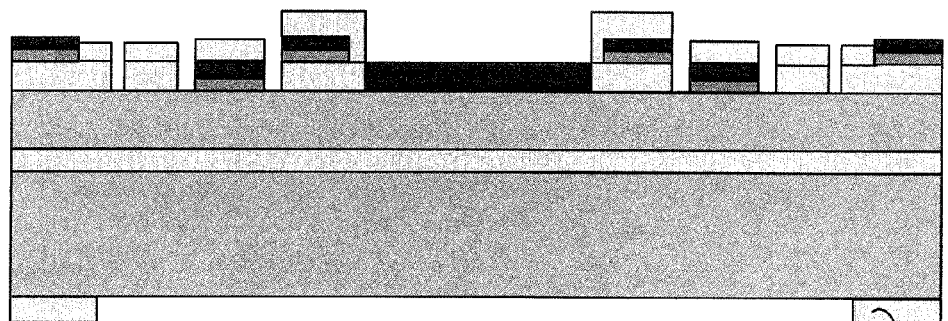
Figure 3F:
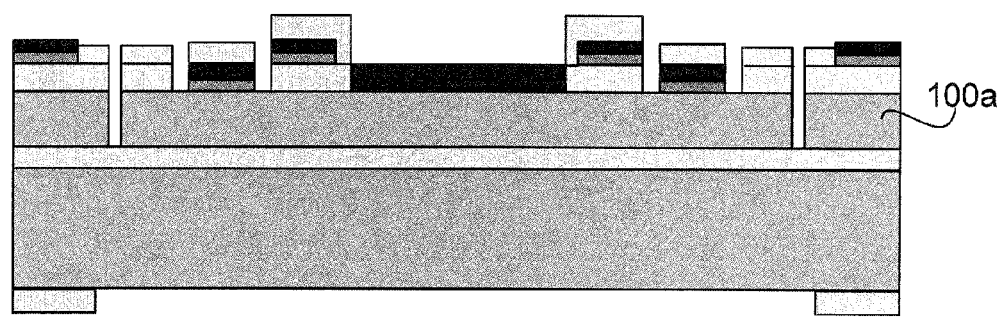

Subsequently, referring to FIG. 3E, a back side insulating layer 106, $SiO_2$ for example, can be patterned to expose a region for the mirror plate, while covering a region that can remain to become protective walls (and/or covering a region that can remain to become support walls between adjacent micromirrors of a micromirror array). Then a front side Si anisotropic etch (of the device layer 100a) can be performed, such as shown in FIG. 3F, to define the mirror plate.

Figure 3G:
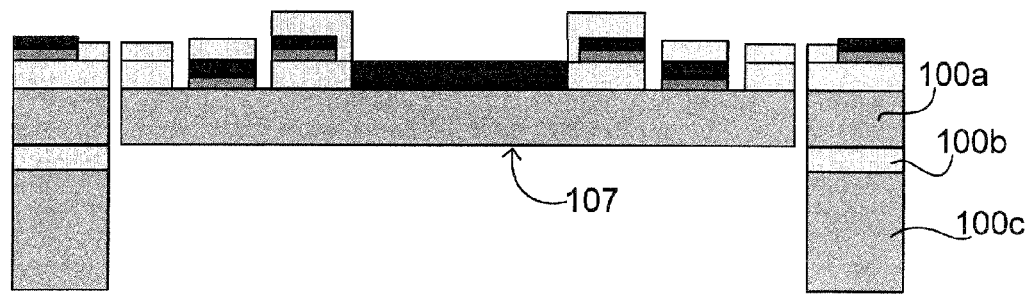
Figure 3H:
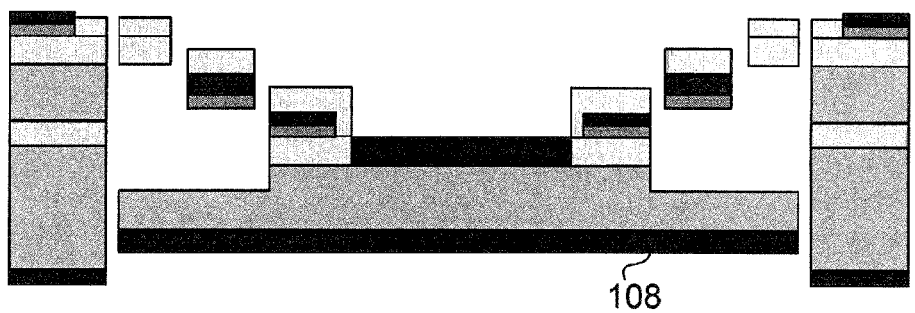

To create a silicon wall protected mirror plate, the following steps illustrated by FIGS. 3G and 3H can be performed. In particular, referring to FIG. 3G, the device is flipped over to have the substrate Si 100c removed so that the original buried $SiO_2/Si$ interface 107 can be exposed to become the mirror plate surface. In one embodiment, the Si substrate 100c and the buried oxide layer 100b are removed. In another embodiment, the buried oxide layer 100b can remain. In yet another embodiment, a portion of the device layer 100a can be etched. Then, the actuators can be released by a subsequent etch as shown in FIG. 3H. A reflective coating 108 can be formed on the exposed mirror plate surface. For example, the reflective coating 108 can be formed by an aluminum deposition step that is performed at the end of the process to increase the optical reflectivity.

In a specific embodiment, the bimorph actuators can be designed such that the initial displacement of the mirror plate does not exceed the thickness of the substrate so that the mirror plate is effectively protected by the protective and/or supporting Si walls beside the mirror. In alternative embodiments, the protective and/or supporting walls can be taller or shorter with respect to the initial displacement of the mirror plate. Further, the thickness of the SOI device layer (see 100a of FIG. 3A) can be chosen such that when the actuators are released, enough Si remains to support the periphery of the mirror plate.

This process can save large device area by hiding the actuators underneath the mirror plate. An array of such high-fill-factor single devices, fabricated as described with respect to FIGS. 3A-3H, can form a high-fill-factor micromirror array.

Figure 4:
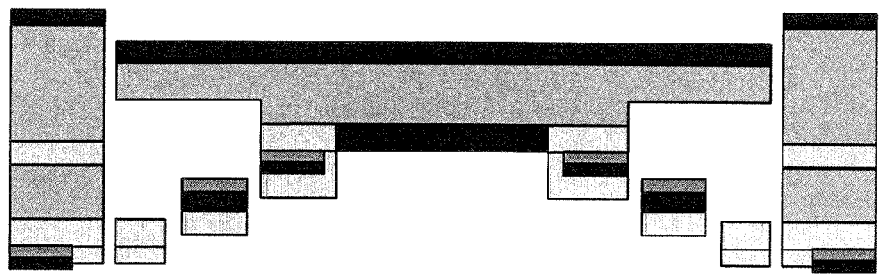
FIG. 4 shows a cross-sectional representation of a high-fill-factor (HFF) micromirror utilizing electrothermal bimorph actuation fabricated in accordance with an embodiment of the subject invention.
Figure 5A:
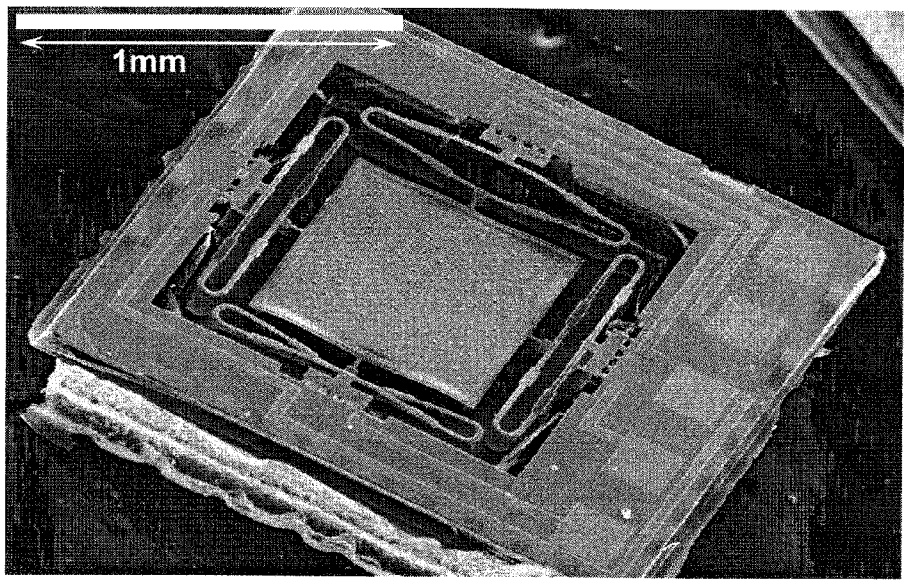
FIGS. 5A and 5B show scanning electron microscope (SEM) images of a single HFF micromirror device, from the actuator side (FIG. 5A), and from the mirror side (FIG. 5B), fabricated in accordance with an embodiment of the subject invention.
Figure 5B:
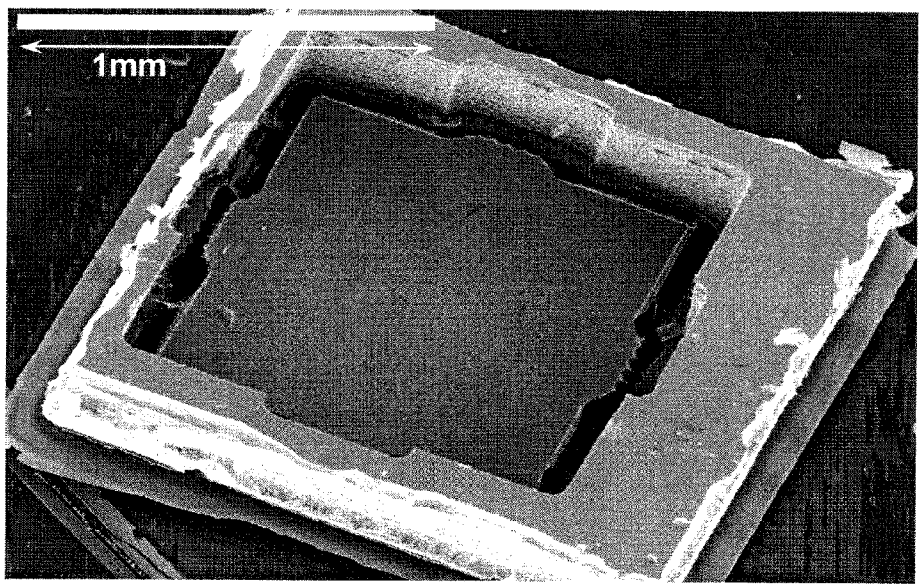
Figure 6:
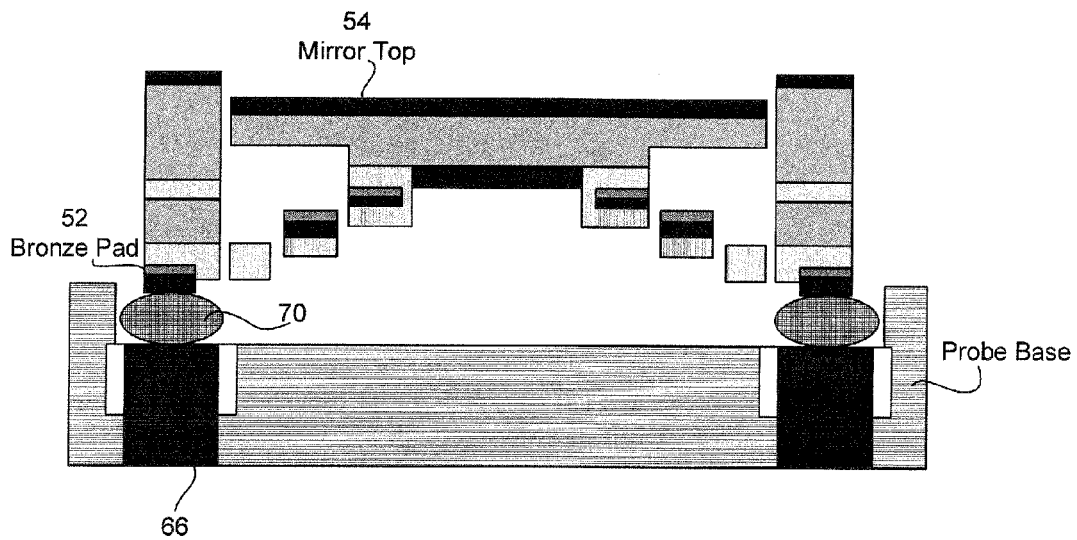
FIG. 6 shows a cross-sectional representation of the HFF micromirror of FIG. 4 directly bonded on an imaging probe without wire bonding in accordance with an embodiment of the subject invention.

Accordingly, a tilt-tip-piston (TTP) micromirror array design is provided that incorporates single-crystal silicon-based micromirrors and hidden actuators. In a specific embodiment the array does not need wafer bonding. According to embodiments of the subject invention, the chip can be flipped over at the end of the fabrication so that the original back surface becomes the reflective top mirror surface, such as shown in FIG. 4 and the SEM images of FIGS. 5A and 5B and FIGS. 13A and 13B. Referring to FIG. 6, after flipping, the bimorph actuators become hidden below the mirror and the bonding pads are ready for flip-chip bonding or surface mounting.

HFF individual micromirrors fabricated in accordance with embodiments of the subject invention can be used as the scan engine for endoscopic imaging applications.

Figure 7:
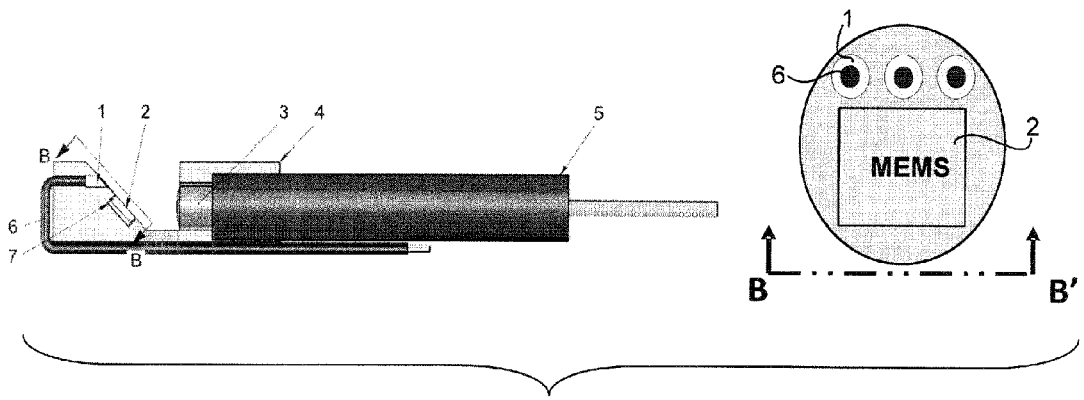
FIG. 7 shows a representation of a dental Optical Coherence Tomography (OCT) imaging product without surface mounting capability, which requires extra room for driving signals.
Figure 8:
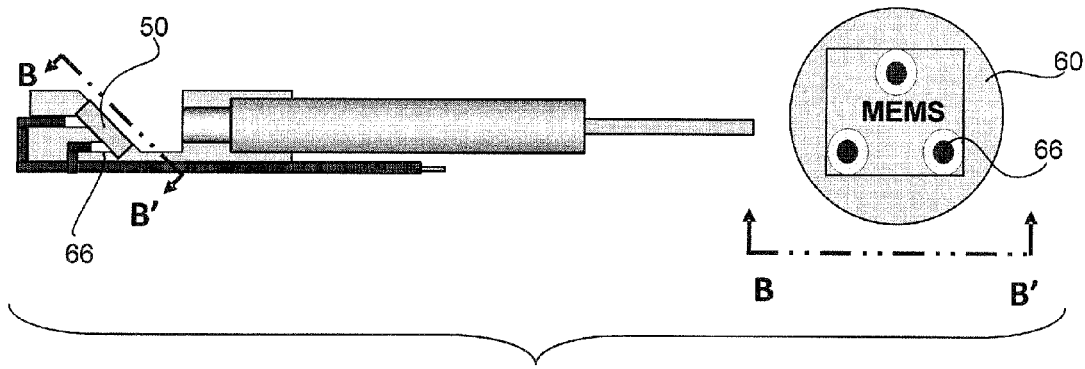
FIG. 8 shows a cross-sectional representation of a miniaturization of a dental OCT imaging product having surface mounting capability, in accordance with embodiments of the subject invention.

In an embodiment, micromirrors fabricated in accordance with embodiments of the present invention can be applied to endoscopic optical imaging applications as the optical scan engine for various imaging modalities including, but not limited to, Confocal Laser Scanning Microscope (CLSM), Non-linear Optical Microscope (NLOM), and Optical Coherence Tomography (OCT). By using micromirrors fabricated in accordance with embodiments of the present invention, further miniaturization of probes and devices for performing the optical imaging applications can be accomplished. A longitudinally cross-sectioned representation of a dental OCT imaging product without surface mounting capability is shown in FIG. 7. The OCT probe includes a non-electrical conductive adhesive 1 surrounding an exposed portion of the driving signals 6; a micromirror pocket 2 having a thermal conductive, non-electrical conductive adhesive 7 for inserting and fixing a micromirror device in place; a GRIN lens 3; an optics housing 4; and an optical fiber 5. As illustrated by the cross-sectional view through line B-B', extra room is required for the driving signals 6, on which wires are attached for connection to the MEMs micromirror device. In an embodiment of the invention, as shown in FIG. 8, surface mounting capability allows further miniaturization of the probe because the driving signals 66 can be directly bonded below the MEMs micromirror device 50.

In particular, referring again to FIG. 6, a HFF micromirror 50 fabricated according to embodiments of the present invention can be directly bonded on the imaging probe without wire bonding. Electrical wires 66 can be embedded or threaded into the probe base 60. The HFF mirror chip 50 can be simply pressed onto the probe base 60 with solder balls or other conductive materials 70 placed either on the probe base 60 (on the exposed electrical wires 66) or the HFF mirror chip 50 (on a bond pad 52). In one embodiment, the electrical wires 66 can be, for example, copper wires. The conductive materials 70 can be, for example, silver epoxy. These copper wires supply the electrical driving signals to the micromirror and are designed according to the corresponding locations of the bond pads on the device. Hence, the device can be directly put on top of the probe base with the mirror plate 54 facing up and the bond pads 52 will automatically make electrical connections with the copper wires upon proper curing of the epoxy. Accurate alignment may not be needed during this assembling process. For example, the alignment can be accomplished by simply designing a mark or a pocket on the probe base 60.

Accordingly, embodiments can also provide High-Fill-Factor Micromirror Arrays that can be used for Optical Phased Array (OPA), Optical Information Display, Adaptive Optics and Astronomy Instrumentation applications. Of course, applications of the subject invention are not limited thereto.

Accordingly, HFF micromirrors based on embodiments of the present invention can greatly ease the design and integration process of the mechanical and optical systems when used as the scanning engine for optical endoscopes. With the surface mounting capability of the micromirror device, the endoscope does not need room for bonding pads and bonding wires, consequently enabling further miniaturization of the endoscope without sacrificing the optical aperture.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

A 4×4 micromirror array and a 2×2 micromirror array were fabricated in accordance with an embodiment of the present invention.

Figure 14A:
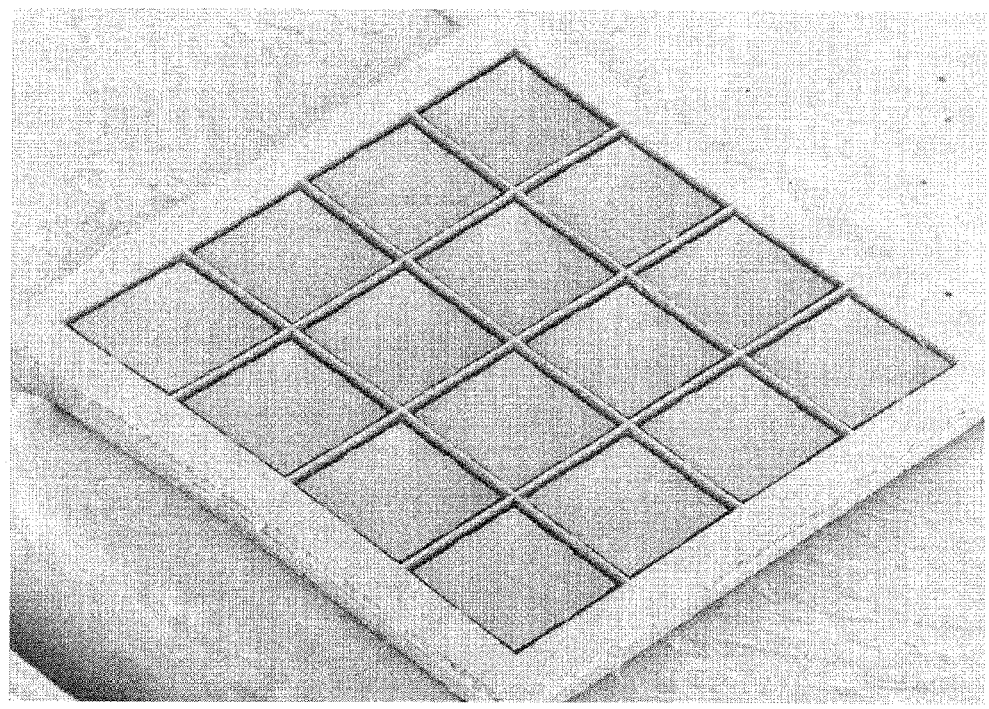
FIGS. 14A-14D show SEMs of a 4×4 micromirror array (MMA) device, fabricated in accordance with an embodiment of the subject invention, where
Figure 14B:
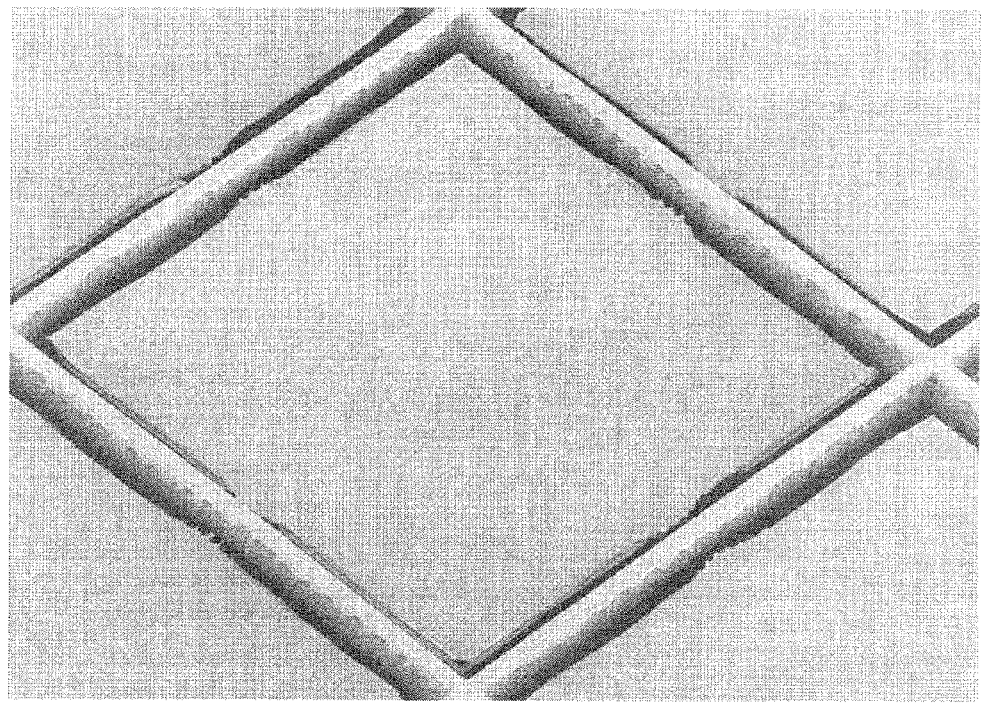
Figure 14C:
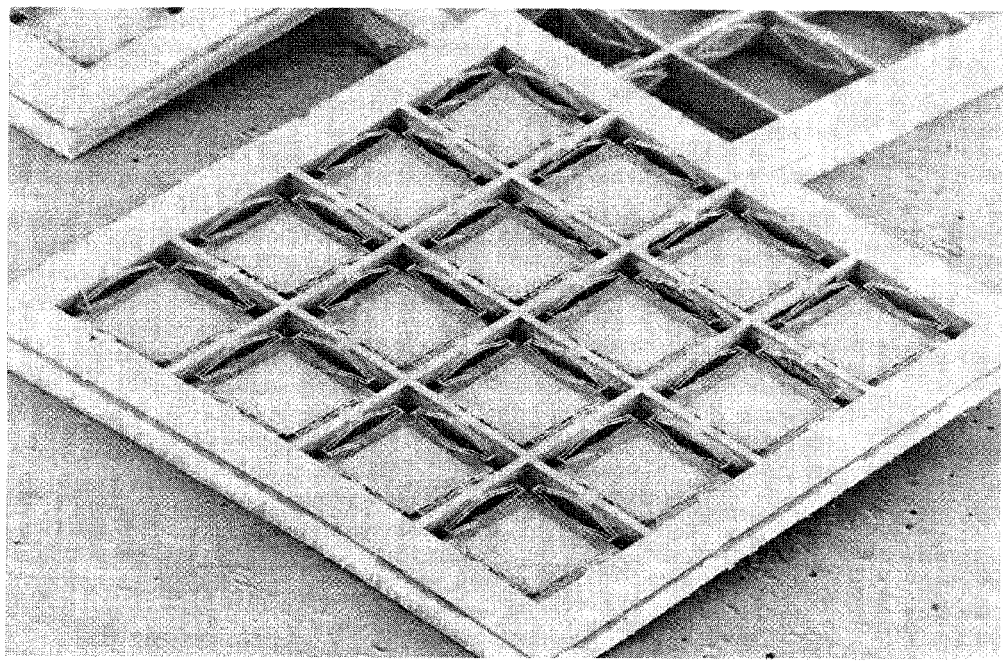
Figure 14D:
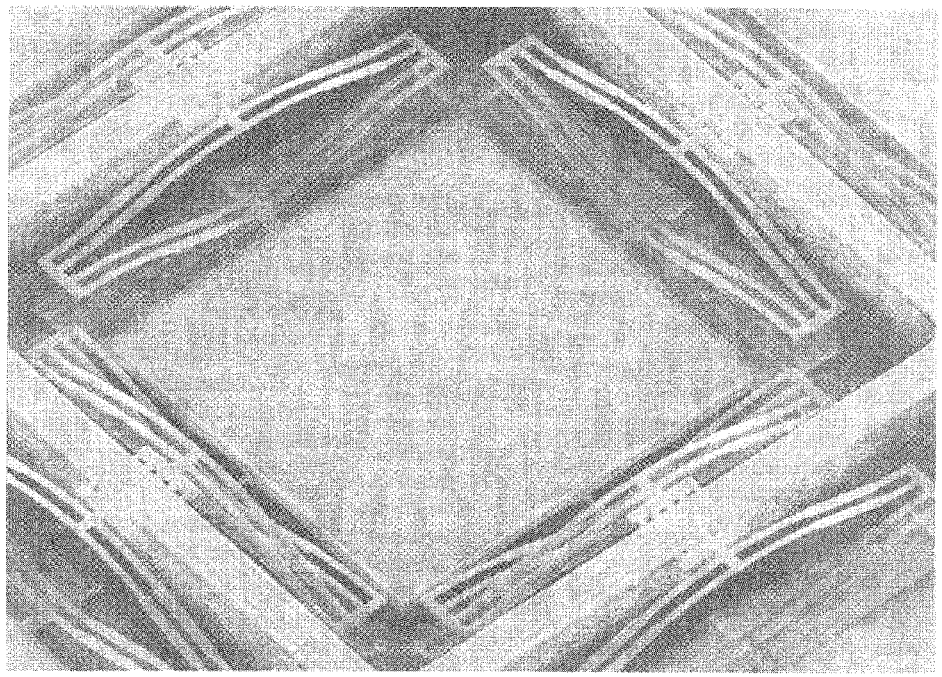

FIGS. 9A-9D show SEM images of the 4×4 micromirror array with an area fill factor of approximately 90%, fabricated in accordance with an embodiment of the present invention. Each mirror pixel can perform tip-tilt-piston motions and is separated from adjacent mirror pixels by Si walls. The Si walls can serve as mechanical supports, and/or as thermal paths for the actuators, and/or as the mechanical protection of the mirror plates. FIG. 9A shows a top view of the array showing the support, or protective, walls and mirror plates. FIG. 9B shows one mirror pixel of the array. FIG. 9C shows a back side view showing bimorph actuators and bonding pads. FIG. 9D shows a close-up of the back side of a mirror pixel showing the four bimorph actuators. FIGS. 14A-14D show a second set of SEM images of a 4×4 micromirror array fabricated in accordance with an embodiment of the present invention. FIG. 14A shows a top view of the array showing the support, or protective, walls and mirror plates. FIG. 14B shows one mirror pixel of the array. FIG. 14C shows a back side view showing bimorph actuators and bonding pads. FIG. 14D shows a close-up of the back side of a mirror pixel showing the four bimorph actuators.

As shown in FIGS. 9A-9D and FIGS. 14A-14D, the bonding pads are on the opposite chip side of the reflective mirror surface, so these micromirror array devices can be flip chip bonded on a CMOS chip or directly mounted on a PCB without wire bonding. Also the mirror plates are below the chip surface, providing good mechanical protection to the fragile mirror plates.

Figure 10A:
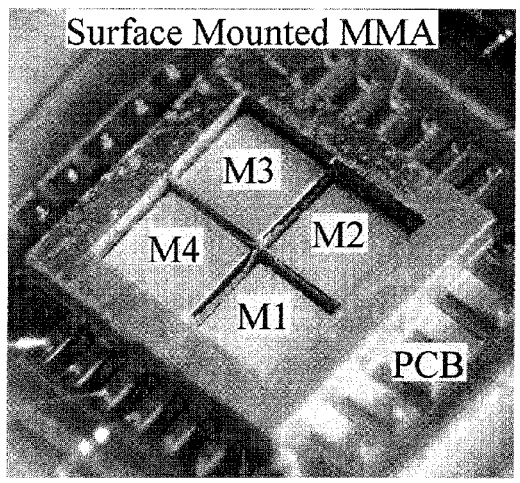
FIGS. 10A-10D show optical images of a surface mounted 2×2 MMA, demonstrating TTP actuation capabilities in accordance with an embodiment of the subject invention. Specifically.
Figure 10B:
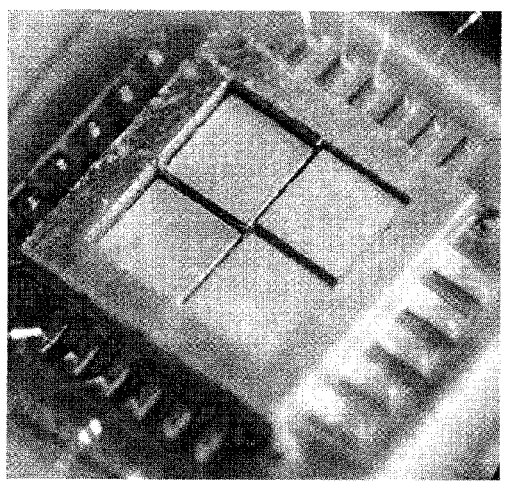
Figure 10C:
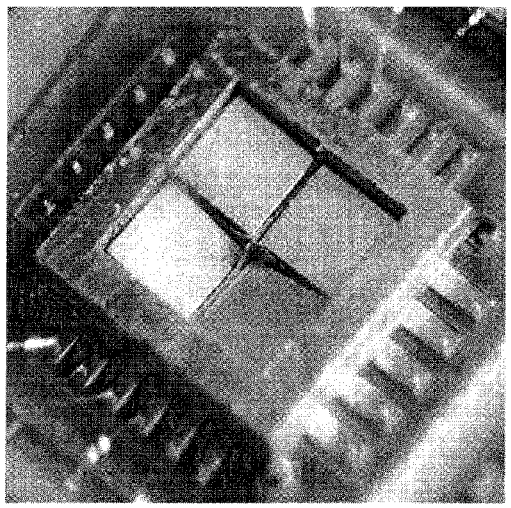
Figure 10D:
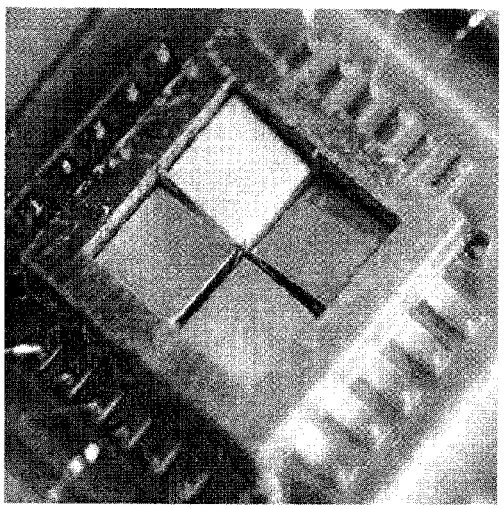

An example of a micromirror array device that is directly mounted on a PCB without wire bonding is shown in FIGS. 10A-10D. FIGS. 10A-10D are optical images of a surface mounted 2×2 micromirror array fabricated in accordance with an embodiment of the present invention, and demonstrate TTP actuation capabilities. Specifically, FIG. 10A shows M1&M2 piston down; FIG. 10B shows M3&M4 piston down; FIG. 10C shows M1&M4 tip tilt; and FIG. 10D shows M2&M3 tip tilt. As shown in FIGS. 10A-10D, the micromirror array can be directly mounted on signal lines and packaged on a PCB, minimizing the area covered by the device. The mirror pixel size in the 2×2 micromirror array shown in FIGS. 10A-10D is 1.5 mm by 1.5 mm.

Figure 11:
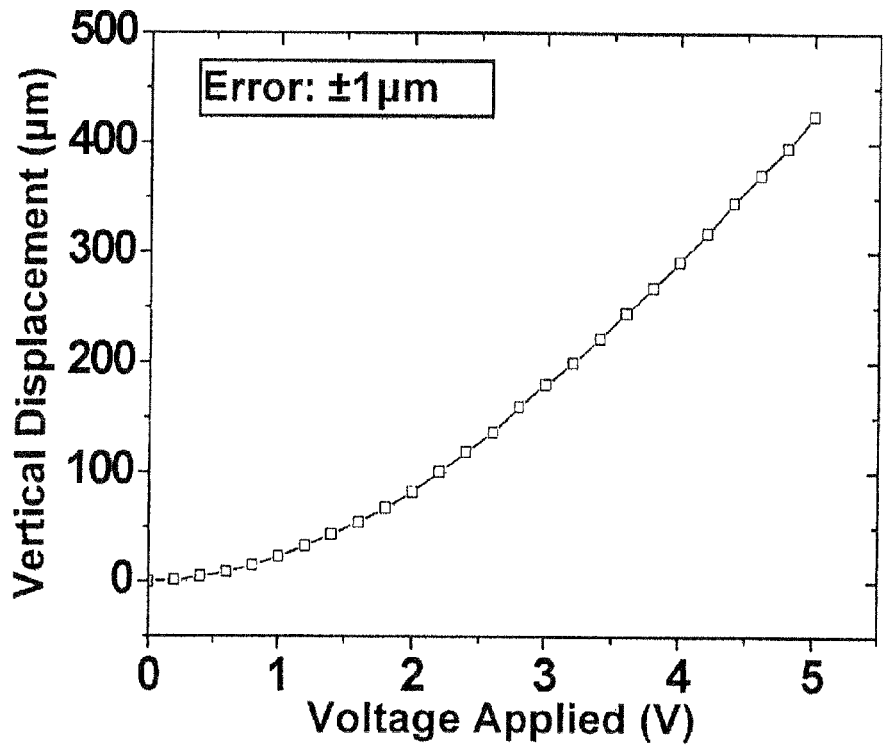
FIG. 11 shows a plot of static piston actuation characterization according to an embodiment of the subject invention.

Mirror motion can be accomplished by applying one or more voltages to the bimorph actuators. In an embodiment, piston motion can be accomplished by applying the same voltage to all four actuators on the four sides of a mirror pixel. The vertical displacement (measured under a microscope) versus applied DC voltage is plotted in FIG. 11. Referring to FIG. 11, it can be seen that a maximum 420 µm displacement was achieved at 5 V DC. Tip or tilt actuation can be accomplished by applying a DC bias voltage (e.g., 2.75 V for this example) to all actuators and superimposing differentially varying voltages to opposing actuator pairs. The static tip/tilt rotation actuation, measured using a laser source and a screen, is plotted in FIG. 12, where a maximum±20° optical scan angle was achieved for both axes at ±2.75 V DC.

Figure 12:
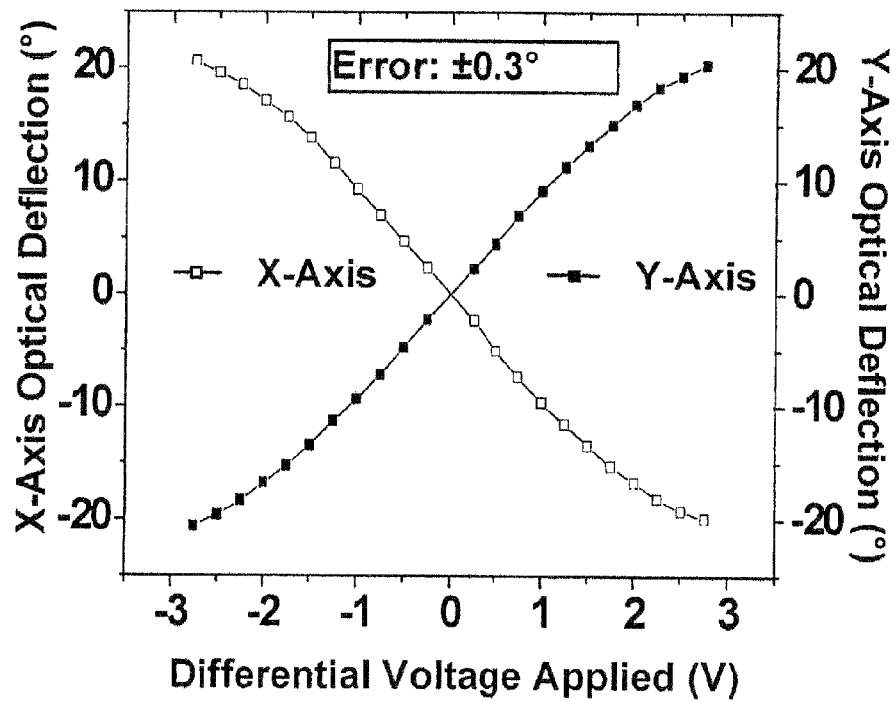
FIG. 12 shows a plot of static rotation actuation characterization according to an embodiment of the subject invention.
Figure 13A:
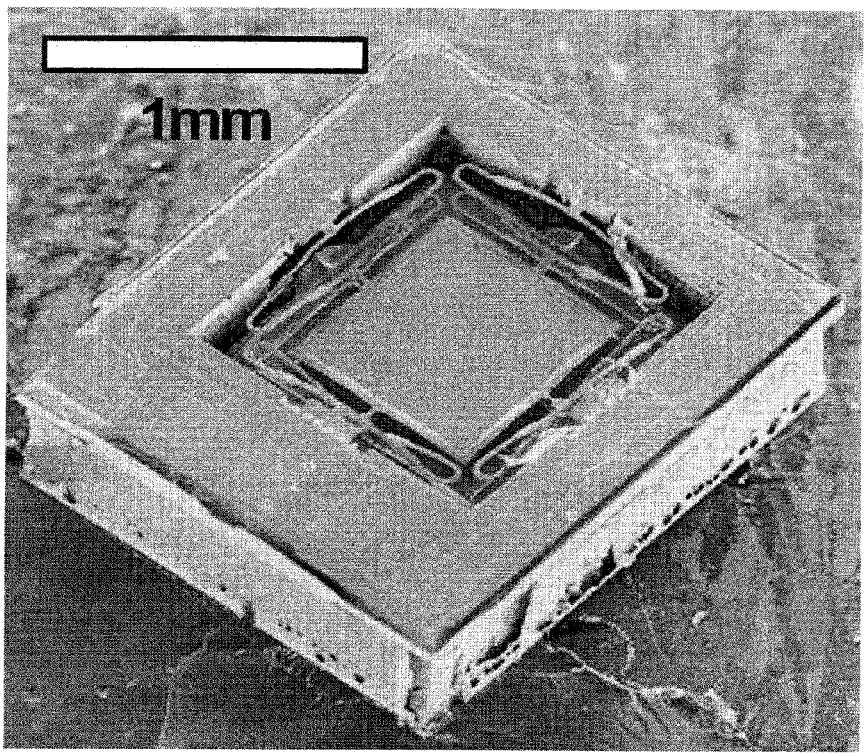
FIGS. 13A and 13B show scanning electron microscope (SEM) images of a single HFF micromirror device, from the actuator side (FIG. 13A), and from the mirror side (FIG. 13B), fabricated in accordance with an embodiment of the subject invention.
Figure 13B:
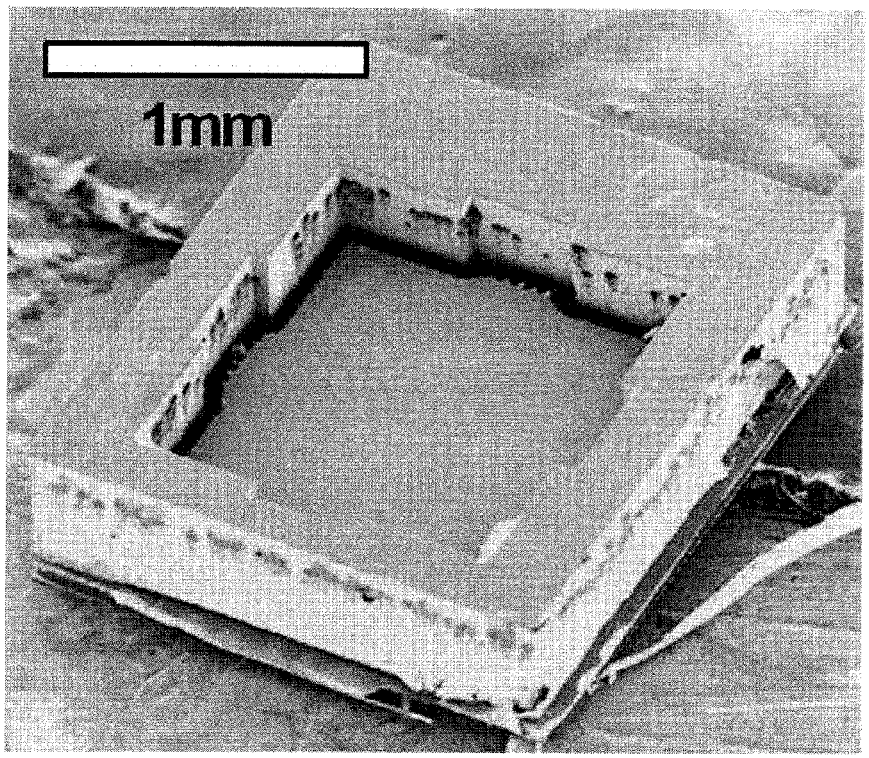

Accordingly, experiments with the device used to produce the data of FIGS. 11 and 12 show that the mirrors can achieve 420 μm vertical piston stroke and ±20° of optical tip-tilt angles all at less than 5.5 V DC.

The mirror surface quality was characterized by a Wyko optical profilometer. The measured radius of curvature of the mirror plate fabricated according to the example embodiment was about 0.4 m with a standard deviation roughness of 70 nm.

Accordingly, by being directly flip-chip bonded on a printed circuit board (PCB) (FIG. 10) or a CMOS or other chip (not shown), electrical connections as well as mechanical protection for the mirror plate and the actuators are easily provided.

Advantageously, embodiments of the subject invention provide a micromirror device and fabrication method thereof capable of one or more of the following aspects: 1. High area fill factor; 2. Small device footprint; 3. Low-cost fabrication process; 4. Simple and compact packaging; 5. Easy device handling and assembling; 6. Tip-tilt-piston degrees of freedom; and 7. Low driving voltage.

In accordance with an implementation of the subject invention, no bonding step required for mirror plate transfer. In addition, automatic mirror plate protection is provided as a result of the fabrication process without requiring a packaging step. Further, embodiments provide a device readily capable for surface mounting/flip chip integration.

Although the present embodiments are described utilizing electrothermal actuation, embodiments of the subject invention are not limited to electrothermal actuated micromirrors. For example, the method steps allowing easy device handling and assembling can be applied to other actuation designs, In certain embodiments, this can be implemented by modifying the fabrication process to include steps for the back side mirror formation and release etch steps (see e.g., FIGS. 3G and 3H). That is, actuator fabrication can be performed on a front side of a wafer substrate and the mirror can be provided at the back side. Further embodiments can include protection of the mirror plate by the side surfaces of the wafer substrate. In addition, although present embodiments are described using bimorph actuators, other multimorph actuators can be used.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. A method of fabricating a micromirror, the method comprising:
    forming at least one electrothermal actuator and at least one bonding pad on a top surface of a semiconductor substrate; and
    etching a portion of the semiconductor substrate from the back side to expose a front surface of a mirror plate, wherein a back side surface of the mirror plate is formed on the top surface of the semiconductor substrate.

2. The method according to claim 1, wherein etching the portion of the back side surface of the semiconductor substrate also exposes at least one substrate wall adjacent the mirror plate.

3. The method according to claim 2, wherein the at least one electrothermal actuator is connected to the at least one substrate wall.

4. The method according to claim 2, wherein a top of one or more of the at least one substrate wall adjacent the mirror plate is even with or above the front surface of the mirror plate when the mirror plate is at a fully raised position.

5. The method according to claim 2, wherein the at least one substrate wall adjacent the mirror plate surrounds the mirror plate in a plane of the mirror plate.

6. A method of fabricating a micromirror, the method comprising:
    forming at least one electrothermal actuator and at least one bonding pad on a top surface of a semiconductor substrate; and
    etching a portion of the semiconductor substrate from the back side to expose a front surface of a mirror plate, wherein the at least one electrothermal actuator is at least one electrothermal multimorph actuator, wherein forming the at least one electrothermal multimorph actuator and the at least one bonding pad on the top surface of the semiconductor substrate comprises:
    depositing a first material layer on the top surface of the semiconductor substrate and patterning the first material layer for the at least one electrothermal multimorph actuator;
    depositing a second material layer on the top surface of the semiconductor substrate including the patterned first material layer and patterning the second material layer to form a thermal element for each of the at least one electrothermal multimorph actuator;
    depositing a third material layer on the top surface of the semiconductor substrate including the patterned second material layer and patterning the third material layer for the at least one electrothermal multimorph actuator; and
    depositing a fourth material layer on the top surface of the semiconductor substrate including the patterned third material layer and patterning the fourth material layer for the at least one electrothermal multimorph actuator, wherein the fourth material layer comprises a same material as the first material layer,
    wherein the first material layer and the third material layer have different coefficients of thermal expansion.

7. The method according to claim 6, wherein the at least one electrothermal multimorph actuator is at least one electrothermal bimorph actuator.

8. The method according to claim 6, wherein a back side surface of the mirror plate is defined by a first pattern on the top surface of the semiconductor substrate.

9. The method according to claim 8, further comprising: patterning the third material layer to form the first pattern.

10. The method according to claim 6, wherein the third material layer comprises metal, wherein forming the at least one electrothermal multimorph actuator and the at least one bonding pad on the top surface of the semiconductor substrate further comprises:
    patterning the third material layer to define bonding pads when patterning the third material layer for the at least one electrothermal multimorph actuator.

11. The method according to claim 6, wherein the third material layer comprises a dielectric or a non-conductive polymer, wherein forming the at least one electrothermal multimorph actuator and the at least one bonding pad on the top surface of the semiconductor substrate further comprises:

patterning the second material layer to define the at least one bonding pad when patterning the second material layer to form the thermal element for each of the at least one electrothermal multimorph actuator.

12. The method according to claim 6, further comprising: patterning the third material layer to define a back side of the mirror plate.

13. The method according to claim 6, wherein the second material layer comprises chrome and platinum, wherein patterning the second material layer to form the thermal element for each of the at least one electrothermal multimorph actuator comprises:

performing an etching or lift-off process with respect to the second material layer comprising the chrome and platinum.

14. The method according to claim 6, wherein the third material layer comprises a polymer, wherein patterning the third material layer for the at least one electrothermal multimorph actuator comprises:

performing an etching or lift-off process with respect to the third material layer comprising the polymer.

15. The method according to claim 14, wherein the polymer is a polyimide or PMMI.

16. A method of fabricating a micromirror, the method comprising:

forming at least one electrothermal actuator and at least one bonding pad on a top surface of a semiconductor substrate; and etching a portion of the semiconductor substrate from the back side to expose a front surface of a mirror plate, wherein the at least one electrothermal actuator is at least one electrothermal multimorph actuator, wherein forming the at least one electrothermal actuator and the at least one bonding pad on the top surface of the semiconductor substrate comprises:

depositing a first insulating layer on the top surface of the semiconductor substrate;

patterning the first insulating layer to form a bottom insulating layer for the at least one electrothermal multimorph actuator;

depositing a first metal on the semiconductor substrate including the patterned first insulating layer, and performing an etching or lift-off process with respect to the first metal to form a first metal layer for each of the at least one electrothermal multimorph actuator;

depositing a second metal or polymer on the semiconductor substrate including the first metal layer and performing a second etching or lift-off process, thereby forming a second metal or polymer pattern for each of the at least one electrothermal multimorph actuator;

depositing a second insulating layer on the semiconductor substrate, including the second metal or polymer pattern; and patterning the second insulating layer to form a top insulating layer for the at least one electrothermal multimorph actuator.

17. The method according to claim 16, wherein depositing the first metal on the semiconductor substrate including the patterned first insulating layer, and performing the etching or a lift-off process with respect to the first metal and depositing the second metal or polymer on the semiconductor substrate including the first metal layer and performing the second etching or lift-off process also forms at least one bonding pad, wherein one or more of the at least one bonding pad is electrically connected to one or more of the at least one electrothermal multimorph actuator.

18. The method according to claim 16, wherein the second metal defines a back side of the mirror plate.

19. The method according to claim 16, further comprising depositing a third insulating layer on the patterned first insulating layer before depositing the first metal.

20. The method according to claim 16, wherein depositing a second metal or polymer on the semiconductor substrate including the first metal layer and performing the second etching or lift-off process comprises:

depositing a second metal on the semiconductor substrate including the first metal layer and performing the second etching or lift-off process with respect to the second metal.

21. The method according to claim 20, wherein the first insulating layer comprises silicon dioxide, the first metal comprises chrome and platinum, the second metal comprises aluminum, and the second insulating layer comprises silicon dioxide.

22. The method according to claim 16, wherein depositing a second metal or polymer on the semiconductor substrate including the first metal layer and performing the second etching or lift-off process comprises:

depositing a polymer on the semiconductor substrate including the first metal layer and performing the second etching or lift-off process with respect to the polymer, thereby forming the polymer pattern.

23. The method according to claim 22, wherein the polymer is a polyimide or PMMI.

24. A method of fabricating a micromirror, the method comprising:

forming at least one electrothermal actuator and at least one bonding pad on a top surface of a semiconductor substrate; and etching a portion of the semiconductor substrate from the back side to expose a front surface of a mirror plate, wherein the semiconductor substrate is a silicon-on-insulator (SOI) substrate, and wherein the etching of the portion of the back side surface of the semiconductor substrate exposes the insulator/silicon interface of the SOI substrate, the insulator/silicon interface providing the front surface of the mirror plate.

25. A method of fabricating a micromirror, the method comprising:

forming at least one electrothermal actuator and at least one bonding pad on a top surface of a semiconductor substrate;

etching a portion of the semiconductor substrate from the back side to expose a front surface of a mirror plate; and depositing a reflective coating on the front surface of the mirror plate.

26. The method according to claim 25, wherein the reflective coating comprises aluminum.

27. The method according to claim 25, wherein the reflective coating comprises gold.

28. A method of packaging a micromirror, wherein the micromirror is fabricated via a method comprising:

forming at least one electrothermal actuator and at least one bonding pad on a top surface of a semiconductor substrate; and etching a portion of the semiconductor substrate from the back side to expose a front surface of a mirror plate, wherein the micromirror is directly flip chip bonded on a printed circuit board using the at least one bonding pad formed on the top surface of the semiconductor substrate.

29. The method according to claim 28, wherein a back side surface of the mirror plate is formed on the top surface of the semiconductor substrate.

30. The method according to claim 29, wherein etching the portion of the back side surface of the semiconductor substrate also exposes at least one substrate wall adjacent the mirror plate.

31. The method according to claim 30, wherein the at least one electrothermal actuator is connected to the at least one substrate wall.

32. The method according to claim 30, wherein a top of one or more of the at least one substrate wall adjacent the mirror plate is even with or above the front surface of the mirror plate when the mirror plate is at a fully raised position.

33. The method according to claim 30, wherein the at least one substrate wall adjacent the mirror plate surrounds the mirror plate in a plane of the mirror plate.

34. The method according to claim 28, wherein the at least one electrothermal actuator is at least one electrothermal multimorph actuator, wherein forming the at least one electrothermal multimorph actuator and the at least one bonding pad on the top surface of the semiconductor substrate comprises:
depositing a first material layer on the top surface of the semiconductor substrate and patterning the first material layer for the at least one electrothermal multimorph actuator;
depositing a second material layer on the top surface of the semiconductor substrate including the patterned first material layer and patterning the second material layer to form a thermal element for each of the at least one electrothermal multimorph actuator;
depositing a third material layer on the top surface of the semiconductor substrate including the patterned second material layer and patterning the third material layer for the at least one electrothermal multimorph actuator; and
depositing a fourth material layer on the top surface of the semiconductor substrate including the patterned third material layer and patterning the fourth material layer for the at least one electrothermal multimorph actuator, wherein the fourth material layer comprises a same material as the first material layer,
wherein the first material layer and the third material layer have different coefficients of thermal expansion.

35. The method according to claim 28, wherein the at least one electrothermal actuator is at least one electrothermal multimorph actuator, wherein forming the at least one electrothermal actuator and the at least one bonding pad on the top surface of the semiconductor substrate comprises:
depositing a first insulating layer on the top surface of the semiconductor substrate;
patterning the first insulating layer to form a bottom insulating layer for the at least one electrothermal multimorph actuator;
depositing a first metal on the semiconductor substrate including the patterned first insulating layer, and performing an etching or lift-off process with respect to the first metal to form a first metal layer for each of the at least one electrothermal multimorph actuator;
depositing a second metal or polymer on the semiconductor substrate including the first metal layer and performing a second etching or lift-off process, thereby forming a second metal or polymer pattern for each of the at least one electrothermal multimorph actuator;
depositing a second insulating layer on the semiconductor substrate, including the second metal or polymer pattern; and
patterning the second insulating layer to form a top insulating layer for the at least one electrothermal multimorph actuator.

36. The method according to claim 28, wherein the semiconductor substrate is a silicon-on-insulator (SOI) substrate, and wherein the etching of the portion of the back side surface of the semiconductor substrate exposes the insulator/silicon interface of the SOI substrate, the insulator/silicon interface providing the front surface of the mirror plate.

37. The method according to claim 28, wherein the method of fabricating the micromirror further comprises:
depositing a reflective coating on the front surface of the mirror plate.

38. A miniature probe formed by directly flip chip bonding a micromirror, wherein the micromirror is fabricated onto a mounting base via a method comprising:
forming at least one electrothermal actuator and at least one bonding pad on a top surface of a semiconductor substrate; and
etching a portion of the semiconductor substrate from the back side to expose a front surface of a mirror plate.

39. The miniature probe according to claim 38, wherein the at least one bonding pad contacts wires exposed at a surface of the mounting base.

40. The miniature probe according to claim 38, wherein the at least one electrothermal actuator of the micromirror comprises at least one electrothermal bimorph actuator, wherein one or more of the at least one bonding pad is electrically connected to one or more of the at least one electrothermal bimorph actuator.

41. The miniature probe according to claim 38, wherein a back side of the mirror plate is formed on the top surface of the semiconductor substrate.

42. The miniature probe according to claim 41, wherein etching the portion of the back side surface of the semiconductor substrate also exposes at least one substrate wall adjacent the mirror plate.

43. The miniature probe according to claim 42, wherein the at least one electrothermal actuator is connected to the at least one substrate wall.

44. The miniature probe according to claim 42, wherein a top of one or more of the at least one substrate wall adjacent the mirror plate is even with or above the front surface of the mirror plate when the mirror plate is at a fully raised position.

45. The miniature probe according to claim 42, wherein the at least one substrate wall adjacent the mirror plate surrounds the mirror plate in a plane of the mirror plate.

46. The miniature probe according to claim 38, wherein the at least one electrothermal actuator is at least one electrothermal multimorph actuator, wherein forming the at least one electrothermal multimorph actuator and the at least one bonding pad on the top surface of the semiconductor substrate comprises:
depositing a first material layer on the top surface of the semiconductor substrate and patterning the first material layer for the at least one electrothermal multimorph actuator;
depositing a second material layer on the top surface of the semiconductor substrate including the patterned first material layer and patterning the second material layer to form a thermal element for each of the at least one electrothermal multimorph actuator;

depositing a third material layer on the top surface of the semiconductor substrate including the patterned second material layer and patterning the third material layer for the at least one electrothermal multimorph actuator; and depositing a fourth material layer on the top surface of the semiconductor substrate including the patterned third material layer and patterning the fourth material layer for the at least one electrothermal multimorph actuator, wherein the fourth material layer comprises a same material as the first material layer, wherein the first material layer and the third material layer have different coefficients of thermal expansion.

47. The miniature probe according to claim 38, wherein the at least one electrothermal actuator is at least one electrothermal multimorph actuator, wherein forming the at least one electrothermal actuator and the at least one bonding pad on the top surface of the semiconductor substrate comprises:

depositing a first insulating layer on the top surface of the semiconductor substrate;

patterning the first insulating layer to form a bottom insulating layer for the at least one electrothermal multimorph actuator;

depositing a first metal on the semiconductor substrate including the patterned first insulating layer, and performing an etching or lift-off process with respect to the first metal to form a first metal layer for each of the at least one electrothermal multimorph actuator;

depositing a second metal or polymer on the semiconductor substrate including the first metal layer and performing a second etching or lift-off process, thereby forming a second metal or polymer pattern for each of the at least one electrothermal multimorph actuator;

depositing a second insulating layer on the semiconductor substrate, including the second metal or polymer pattern; and patterning the second insulating layer to form a top insulating layer for the at least one electrothermal multimorph actuator.

48. The miniature probe according to claim 38, wherein the semiconductor substrate is a silicon-on-insulator (SOI) substrate, and wherein the etching of the portion of the back side surface of the semiconductor substrate exposes the insulator/silicon interface of the SOI substrate, the insulator/silicon interface providing the front surface of the mirror plate.

49. The miniature probe according to claim 38, wherein the method of fabricating the micromirror further comprises:

depositing a reflective coating on the front surface of the mirror plate.

* * * * *